United States Patent
Salcedo et al.

(10) Patent No.: US 9,184,098 B2
(45) Date of Patent: Nov. 10, 2015

(54) BIDIRECTIONAL HETEROJUNCTION COMPOUND SEMICONDUCTOR PROTECTION DEVICES AND METHODS OF FORMING THE SAME

(71) Applicant: ANALOG DEVICES, INC., Norwood, MA (US)

(72) Inventors: Javier Alejandro Salcedo, North Billerica, MA (US); Srivatsan Parthasarathy, Acton, MA (US); Shuyun Zhang, Allston, MA (US)

(73) Assignee: Analog Devices, Inc., Norwood, MA (US)

( * ) Notice: Subject to any disclaimer, the term of this patent is extended or adjusted under 35 U.S.C. 154(b) by 279 days.

(21) Appl. No.: 13/625,577

(22) Filed: Sep. 24, 2012

(65) Prior Publication Data
US 2014/0084347 A1  Mar. 27, 2014

(51) Int. Cl.
*H01L 29/778* (2006.01)
*H01L 21/8252* (2006.01)
*H01L 27/02* (2006.01)
(Continued)

(52) U.S. Cl.
CPC ........ *H01L 21/8252* (2013.01); *H01L 27/0248* (2013.01); *H01L 27/0605* (2013.01); *H01L 29/7786* (2013.01); *H01L 29/2003* (2013.01); *H01L 29/205* (2013.01)

(58) Field of Classification Search
CPC .................. H01L 29/66431; H01L 29/66462; H01L 29/778; H01L 29/7781; H01L 29/7782; H01L 29/7783; H01L 29/7784; H01L 29/7785; H01L 29/7786; H01L 29/7787

USPC .................. 257/194, 195, E29.246, E29.247, 257/E29.248, E29.249, E29.25, E29.251, 257/E29.252, E29.253, E21.403, E21.407
See application file for complete search history.

(56) References Cited

U.S. PATENT DOCUMENTS

RE33,584 E * 5/1991 Mimura ........................ 257/194
5,686,741 A * 11/1997 Ohori et al. ................... 257/192
(Continued)

OTHER PUBLICATIONS

Lin et al.,"*The Monolithic Integration of InGaAs pHEMT and InGaP HBT Technology for Single-Chip WiMAX RF Front-End Module*", HBT Technology Department, WIN Semiconductors Corp, MWSCAS 2011 IEEE, 4 pages.
(Continued)

*Primary Examiner* — Anthony Ho
*Assistant Examiner* — Samuel Lair
(74) *Attorney, Agent, or Firm* — Knobbe Martens Olson & Bear LLP (57) ABSTRACT

A protection circuit including a multi-gate high electron mobility transistor (HEMT), a forward conduction control block, and a reverse conduction control block is provided between a first terminal and a second terminal. The multi-gate HEMT includes an explicit drain/source, a first depletion-mode (D-mode) gate, a first enhancement-mode (E-mode) gate, a second E-mode gate, a second D-mode gate, and an explicit source/drain. The drain/source and the first D-mode gate are connected to the first terminal and the source/drain and the second D-mode gate are connected to the second terminal. The forward conduction control block turns on the second E-mode gate when a voltage difference between the first and second terminals is greater than a forward conduction trigger voltage, and the reverse conduction control block turns on the first E-mode gate when the voltage difference is more negative than a reverse conduction trigger voltage.

26 Claims, 7 Drawing Sheets

(51) Int. Cl.
  *H01L 27/06* (2006.01)
  *H01L 29/20* (2006.01)
  *H01L 29/205* (2006.01)

(56) References Cited

U.S. PATENT DOCUMENTS

| | | | |
|---|---|---|---|
| 8,723,227 B2 * | 5/2014 | Parthasarathy et al. | 257/194 |
| 2009/0194793 A1 * | 8/2009 | Briere | 257/201 |
| 2009/0206363 A1 * | 8/2009 | Machida et al. | 257/133 |
| 2012/0256233 A1 * | 10/2012 | Cui et al. | 257/195 |
| 2012/0262828 A1 | 10/2012 | Muthukrishnan et al. | |

OTHER PUBLICATIONS

Gupta et al., "InGaP-*Plus*™—A major advance in GaAs HBT Technology", Anadigics, Inc., CSIC 2006 IEEE, pp. 179-182.

Peatman et al., "InGaP-*Plus*™: Advanced GaAs BiFET Technology and Applications" Anadigics, Inc., CS Mantech Conference, May 2007, pp. 243-246.

Streit et al., "*Monolithic HEMT-HBT Integration for Novel Microwave Circuit Applications*", TRW Electronic Systems and Technology Division, GaAs IC Symposium, 1994 IEEE, pp. 329-332.

Streit et al., "*Monolithic HEMT-HBT Integrating by Selective MBE*", IEEE Transactions on Electron Devices, vol. 42, No. 4, Apr. 1995, pp. 618-623.

Ho et al., "*A GaAs BiFET LSI Technology*", GaAS IC Symposium, 1994 IEEE, pp. 47-50.

Chang, M. F., "*Heterojunction BiFET Technology for High Speed Electronic Systems*", WOFE 1997 IEEE, pp. 15-20.

Chang, M. F., "A Manufacturable GaAs BiFET Technology for High Speed Signal Processing", ISSE 1995 IEEE, pp. 279-282.

Cui, et al., "*Development of a New pHEMT-Based Electrostatic Discharge Protection Structure*", IEEE Transactions on Electron Devices, vol. 58, No. 9, Sep. 2011.

Notice of Allowance in U.S. Appl. No. 13/625,611, dated Dec. 31, 2013, in 13 pages.

\* cited by examiner

BIDIRECTIONAL HETEROJUNCTION COMPOUND SEMICONDUCTOR PROTECTION DEVICES AND METHODS OF FORMING THE SAME

CROSS-REFERENCE TO RELATED APPLICATIONS

This application is related to U.S. application Ser. No. 13/625,611, entitled "HETEROJUNCTION COMPOUND SEMICONDUCTOR PROTECTION CLAMPS AND METHODS OF FORMING THE SAME" (Inventors: Srivatsan Parthasarathy, Javier Alejandro Salcedo, and Shuyun Zhang; filed on even date herewith), the disclosure of which is incorporated herein by reference in its entirety.

BACKGROUND

1. Field

Embodiments of the invention relate to electronic systems, and more particularly, to protection devices for compound semiconductor circuitry, such as gallium arsenide (GaAs) circuitry.

2. Description of the Related Technology

Electronic circuits can be exposed to transient electrical events, or electrical signals of a relatively short duration having rapidly changing voltage and high power. Transient electrical events can include, for example, electrical discharge/electrostatic overstress (ESD/EOS) events arising from the abrupt release of charge from an object or person to an electronic circuit. Transient electrical events can damage an integrated circuit (IC) due to overvoltage conditions and/or high levels of power dissipation over relatively small areas of the IC. High power dissipation can increase circuit temperature, and can lead to numerous problems, such as junction damage, metal damage, and/or surface charge accumulation.

Transient electrical event protection can be difficult to provide for certain gallium arsenide (GaAs) or other compound semiconductor circuitry, including, for example, radio frequency (RF) power amplifiers, attenuators, gain blocks, multi-voltage circuits, drivers, and/or switches. For instance, conventional ESD/EOS protection devices can have a large parasitic capacitance that can adversely impact circuit gain, linearity, and/or bandwidth, and thus can be unsuitable for protecting such circuits. Additionally, the performance of ESD/EOS protection devices can be limited by the relatively low thermal conductivity and/or current-handling capability associated with compound semiconductor technologies. Accordingly, there is a need for improved protection devices and circuits for providing protection to compound semiconductor circuitry, including, for example, protection devices and circuits having high current-handling capability and compact area.

SUMMARY

In one embodiment, an apparatus includes a multi-gate high electron mobility transistor (HEMT) including a drain/source, a source/drain, a first depletion-mode (D-mode) gate, a second D-mode gate, a first enhancement-mode (E-mode) gate, and a second E-mode gate. The first E-mode gate is disposed between the first and second D-mode gates, and the second E-mode gate is disposed between the first E-mode gate and the second D-mode gate. The drain/source and the first D-mode gate are electrically connected to a first terminal, and the source/drain and the second D-mode gate are electrically connected to a second terminal. The apparatus further includes a forward conduction control block and a reverse conduction control block. The forward conduction control block is electrically connected between the first terminal and the second terminal and is configured to control a voltage of the gate of the second E-mode gate. The forward conduction control block is configured to turn on the second E-mode gate when a voltage difference between the first and second terminals is greater than a forward conduction trigger voltage and to otherwise bias the second E-mode gate based on a voltage of the second terminal. The reverse conduction control block is electrically connected between the first terminal and the second terminal and is configured to control a voltage of the gate of the first E-mode gate. The reverse conduction control block is configured to turn on the first E-mode gate when the voltage difference is less than a reverse conduction trigger voltage and to otherwise bias the first E-mode gate based on a voltage of the first terminal.

In another embodiment, an apparatus includes a substrate, a heterojunction structure disposed over the substrate, a drain/source region disposed over the heterojunction structure and electrically connected to a first terminal, a source/drain region disposed over the heterojunction structure and electrically connected to a second terminal, a first E-mode gate region disposed over the heterojunction structure between the drain/source region and the source/drain region, a first D-mode gate region disposed over the heterojunction structure between the drain/source region and the first E-mode gate region, a second enhancement-mode (E-mode) gate region disposed over the heterojunction structure between the source/drain region and the first E-mode gate region, a second D-mode gate region disposed over the heterojunction structure between the source/drain region and the second E-mode gate region, a forward conduction control block, and a reverse conduction control block. The first D-mode gate region is electrically connected to the first terminal, and the second D-mode gate region is electrically connected to the second terminal. The forward conduction control block is electrically connected between the first terminal and the second terminal and is configured to control a voltage of the second E-mode gate region. The reverse conduction control block is electrically connected between the first terminal and the second terminal and is configured to control a voltage of the first E-mode gate region.

In another embodiment, a method of making a compound semiconductor bidirectional protection circuit is provided. The method includes forming a heterojunction structure over a substrate, forming a drain/source region over the heterojunction structure, forming a source/drain region over the heterojunction structure, forming a first E-mode gate region over the heterojunction structure, forming a first D-mode gate region over the heterojunction structure, forming a second E-mode gate region over the heterojunction structure, forming a second D-mode gate region over the heterojunction structure, forming a forward conduction control block, and forming a reverse conduction control block. The first E-mode gate region is disposed between the drain/source region and the source/drain region, and the first D-mode gate region is disposed between the drain/source region and the first E-mode gate region. Additionally, the second E-mode gate region is disposed between the source/drain region and the first E-mode gate region, and the second D-mode gate region is disposed between the source/drain region and the second E-mode gate region. The forward conduction control block includes a first terminal electrically connected to the drain/source region and the first D-mode gate region, a second terminal electrically connected to the source/drain region and the second D-mode gate region, and a control terminal electrically connected to the second E-mode gate region. The reverse conduction control block includes a first terminal electrically connected to the drain/source region and the first D-mode gate region, a second terminal electrically connected to the source/drain region and the second D-mode gate region, and a control terminal electrically connected to the first E-mode gate region.

In another embodiment, an apparatus includes a multi-gate HEMT including a drain/source, a source/drain, a first E-mode gate, a second E-mode gate, a forward conduction control block, and a reverse conduction control block. The first E-mode gate is disposed between the drain/source and the second E-mode gate, and the second E-mode gate is disposed between the first E-mode gate and the source/drain. The drain/source is electrically connected to a first terminal, and the source/drain is electrically connected to a second terminal. The forward conduction control block is electrically connected between the first terminal and the second terminal and is configured to control a voltage of the gate of the second E-mode gate. The forward conduction control block is configured to turn on the second E-mode gate when a voltage difference between the first and second terminals is greater than a forward conduction trigger voltage and to otherwise bias the second E-mode gate based on a voltage of the second terminal. The reverse conduction control block is electrically connected between the first terminal and the second terminal and is configured to control a voltage of the gate of the first E-mode gate. The reverse conduction control block is configured to turn on the first E-mode gate when the voltage difference is less than a reverse conduction trigger voltage and to otherwise bias the first E-mode gate based on a voltage of the first terminal.

DETAILED DESCRIPTION OF CERTAIN EMBODIMENTS

The following detailed description of certain embodiments presents various descriptions of specific embodiments of the invention. However, the invention can be embodied in a multitude of different ways as defined and covered by the claims.

In this description, reference is made to the drawings where like reference numerals indicate identical or functionally similar elements.

Bidirectional heterojunction compound semiconductor protection circuits and methods of forming the same are provided. In certain implementations, a protection circuit is provided between a first terminal and a second terminal, and includes a multi-gate high electron mobility transistor (HEMT), a forward conduction control block, and a reverse conduction control block. The multi-gate HEMT includes a drain/source, a first depletion-mode (D-mode) gate, a first enhancement-mode (E-mode) gate, a second E-mode gate, a second D-mode gate, and a source/drain. The multi-gate HEMT is connected between the first and second terminals with the drain/source and the first D-mode gate coupled to the first terminal and with the source/drain and the second D-mode gate coupled to the second terminal. The forward conduction control block provides an activation voltage to the second E-mode gate when a voltage difference between the first and second terminals is greater than a forward conduction trigger voltage, and otherwise biases the second E-mode gate based on the voltage of the second terminal. Additionally, the reverse conduction control block provides an activation voltage to the first E-mode gate when the voltage difference between the first and second terminals is less than a reverse conduction trigger voltage, and otherwise biases the first E-mode gate based on the voltage of the first terminal.

The forward and reverse conduction control blocks operate the protection circuit in a high impedance state during normal operating conditions associated with the voltage difference between the first and second terminals being greater than the reverse trigger activation voltage but less than the forward trigger activation voltage. However, when the voltage difference between the first and second terminals is greater than the forward activation trigger voltage or when the voltage difference between the first and second terminals is less than the reverse activation trigger voltage, the forward and reverse conduction control blocks operate the protection circuit in a low impedance state used to provide transient electrical event protection.

The forward and reverse conduction control blocks can be separately tuned to provide desired forward and reverse conduction trigger voltages so that a desired protection characteristic can be provided. The forward and reverse conduction trigger voltages can be symmetric or asymmetric, and can include high or low blocking voltage levels. The protection circuit can exhibit fast activation time, small area, and a low parasitic capacitance.

Figure 1:
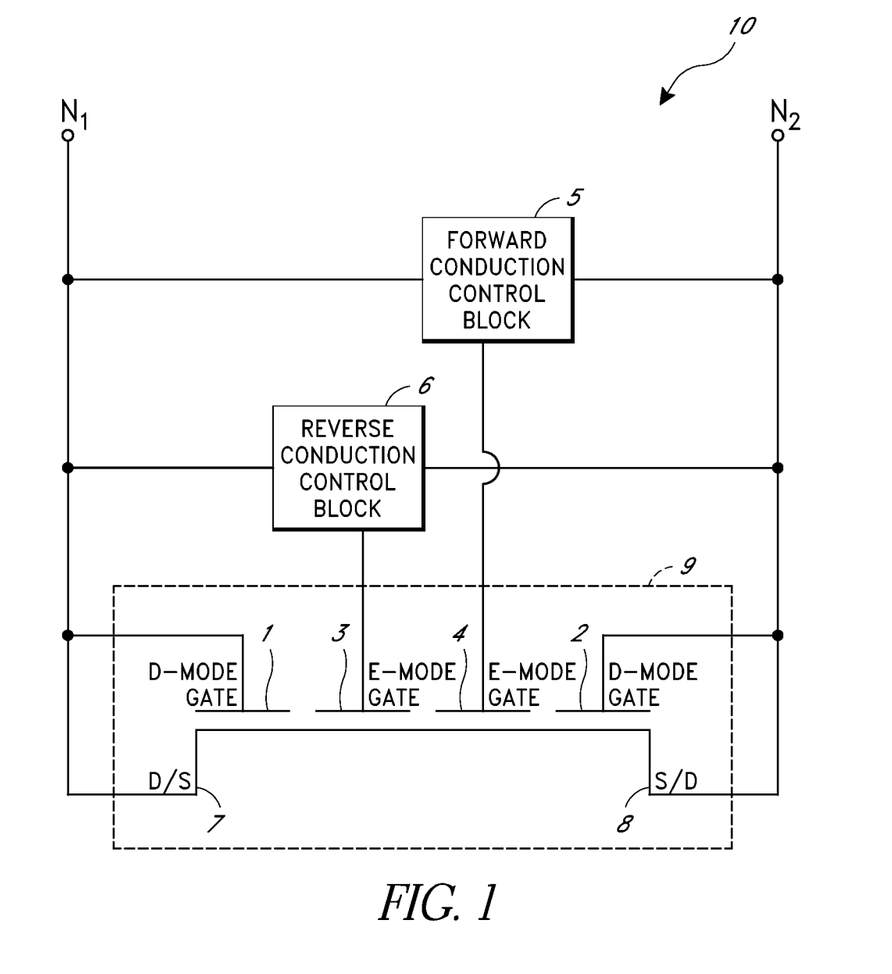
FIG. 1 is a circuit diagram of one embodiment of a bidirectional blocking voltage heterojunction compound semiconductor protection circuit.

FIG. 1 is a circuit diagram of one embodiment of a bidirectional blocking voltage heterojunction compound semiconductor protection circuit 10. The protection circuit 10 includes a forward conduction control block 5, a reverse conduction control block 6, and a multi-gate high electron mobility transistor (HEMT) 9. The multi-gate HEMT 9 includes a drain/source region 7, a source/drain region 8, a first depletion-mode (D-mode) gate 1, a second D-mode gate 2, a first enhancement-mode (E-mode) gate 3, and a second E-mode gate 4. As shown in FIG. 1, the protection circuit 10 is electrically connected between a first terminal $N_1$ and a second terminal $N_2$.

The forward conduction control block 5 includes a first input electrically connected to the first terminal $N_1$, a second input electrically connected to the second terminal $N_2$, and a control output electrically connected to the second E-mode gate 4. The reverse conduction control block 6 includes a first input electrically connected to the first terminal $N_1$, a second input electrically connected to the second terminal $N_2$, and a control output electrically connected to first E-mode gate 3. The drain/source 7 and the first D-mode gate 1 are electrically connected to the first terminal $N_1$, and the source/drain 8 and the second D-mode gate 2 are electrically connected to the second terminal $N_2$.

The multi-gate HEMT 9 can operate bi-directionally, and an operation of the drain/source 7 and the source/drain 8 as a drain or source can depend on the voltage conditions of the first and second terminals $N_1$, $N_2$. For example, when a voltage of the first terminal $N_1$ is greater than a voltage of the second terminal $N_2$, the drain/source 7 of the multi-gate HEMT 9 serves as a drain and the source/drain 8 of the multi-gate HEMT 9 serves as a source. In contrast, when a voltage of the first terminal $N_1$ is less than a voltage of the second terminal $N_2$, the drain/source 7 of the multi-gate HEMT 9 serves as a source and the source/drain 8 of the multi-gate HEMT 9 serves as a drain.

The first and second D-mode gates 1, 2 are depletion mode or normally-on gates having a threshold voltage that is less than or equal to about 0 V. In contrast, the first and second E-mode gates 3, 4 are enhancement mode or normally-off gates having a threshold voltage greater than about 0 V. In one embodiment, the first and second D-mode gates 1, 2 have a threshold voltage in the range of about −1 V to about −2 V, and the first and second E-mode gates 3, 4 have a threshold voltage in the range of about 0.3 V to about 0.5 V.

The first and second D-mode gates 1, 2 are coupled to the drain/source region 7 and the source/drain region 8, respectively. Since the first and second D-mode gates 1, 2 are normally-on or depletion-mode structures, connecting the first and second D-mode gates 1, 2 in this configuration can be used to bias a first portion of the channel between the first D-mode gate 1 and the first E-mode gate 3 to be about equal to the voltage of the first terminal $N_1$, and to bias a second portion of the channel between the second D-mode gate 2 and the second E-mode gate 4 to be about equal to the voltage of the second terminal $N_2$.

The multi-gate HEMT 9 can be any suitable high electron mobility transistor, such as a gallium arsenide (GaAs), indium phosphide (InP), or gallium nitride (GaN) HEMT. As skilled artisans will appreciate, a HEMT can also be referred to as a modulation-doped field effect transistor (MODFET) or a heterojunction field effect transistor (HFET). In one embodiment, the multi-gate HEMT 9 is a pseudomorphic high electron mobility transistor (pHEMT).

The first and second terminals $N_1$, $N_2$ can operate within a defined range of voltage during normal circuit operating conditions, such as a voltage operating range associated with an integrated circuit's design and/or specification. In certain implementations normal circuit operating conditions can be associated with a voltage difference between the first terminal $N_1$ and the second terminal $N_2$ between about +15 V and about −15 V. However, other suitable operating voltage conditions will be readily determined by persons having ordinary skill in the art.

In one embodiment, the first terminal $N_1$ is connected to a first signal pad of an IC and the second terminal $N_2$ is connected to a second signal pad of the IC. However, other implementations are possible, such as configurations in which the first terminal $N_1$ is connected to a power high supply and the second terminal $N_2$ is connected to a power low supply, configurations in which the first terminal $N_1$ is connected to a power high or power low supply and the second terminal $N_2$ is connected to a signal pad, or configurations in which the first terminal $N_1$ is connected to a signal pad and the second terminal $N_2$ is connected to a power high or power low supply.

The forward conduction control block 5 can bias the second E-mode gate 4 to be equal to or near the voltage of the second terminal $N_2$ when a voltage difference between the first terminal $N_1$ and the second terminal $N_2$ is less than a forward conduction trigger voltage of the forward conduction control block 5. However, when the voltage difference between the first and second terminals $N_1$, $N_2$ is greater than the forward conduction trigger voltage, the forward conduction control block 5 can turn on the second E-mode gate 4 by providing an activation voltage to the second E-mode gate 4 sufficient to provide a conductive path beneath the second E-mode gate 4 through the HEMT's channel.

Additionally, the reverse conduction control block 6 can bias the first E-mode gate 3 to be equal to or near the voltage of the first terminal $N_1$ when a voltage difference between the first terminal $N_1$ and the second terminal $N_2$ is greater than a reverse conduction trigger voltage of the reverse conduction control block 6. However, when the voltage difference between the first and second terminals $N_1$, $N_2$ is less than the reverse conduction trigger voltage, the reverse conduction control block 6 can turn on the first E-mode gate 3 by providing an activation voltage to the first E-mode gate 3.

Configuring the forward and reverse conduction control blocks 5, 6 in this manner allows the protection circuit 10 to be in a high impedance or off state during normal operating conditions associated with the voltage difference between the first and second terminals $N_1$, $N_2$ being greater than the reverse trigger activation voltage but less than the forward trigger activation voltage. However, when the voltage difference between the first and second terminals $N_1$, $N_2$ is greater than the forward activation trigger voltage or when the voltage difference between the first and second terminals $N_1$, $N_2$ is less than the reverse activation trigger voltage, the protection circuit 10 can transition into a low impedance or on state. Thus, the protection circuit 10 can be used to protect circuitry connected to the first and/or second terminals $N_1$, $N_2$ from a transient electrical event, such as an overvoltage and/or undervoltage event caused by user contact or generated by a manufacturer to test the robustness of an IC under a defined stress condition.

When a voltage difference between the first and second terminals $N_1$, $N_2$ is positive but less than the forward conduction trigger voltage, the forward conduction control block 5 can turn off the second E-mode gate 4 by biasing the second E-mode gate 4 such that a voltage difference between the second E-mode gate 4 and the source/drain 8 is less than the threshold voltage of the second E-mode gate 4. Thus, even though the first E-mode gate 3 can be turned on when a voltage difference between the first and second terminals $N_1$, $N_2$ is positive, the forward conduction control block 5 can maintain the portion of the channel beneath the second E-mode gate 4 in a blocked or nonconductive state until the voltage difference between the first and second terminals $N_1$, $N_2$ is greater than the forward conduction trigger voltage.

Similarly, when a voltage difference between the first and second terminals $N_1$, $N_2$ is negative but greater than the reverse conduction trigger voltage, the reverse conduction control block 6 can turn off the first E-mode gate 3 by biasing the first E-mode gate 3 such that a voltage difference between the first E-mode gate 3 and the drain/source 7 is less than the threshold voltage of the first E-mode gate 3. Thus, even though the second E-mode gate 4 can be turned on when a voltage difference between the first and second terminals $N_1$, $N_2$ is negative, the reverse conduction control block 6 can maintain the portion of the channel beneath the first E-mode gate 3 in a nonconductive state or off state until the voltage difference between the first and second terminals $N_1$, $N_2$ is less than the reverse conduction trigger voltage.

Thus, the forward conduction control block 5 can be used to control the protection circuit's forward activation trigger voltage and the reverse conduction control block 6 can be used to control the protection circuit's reverse activation trigger voltage. The forward and reverse activation trigger voltages can be separately tuned to achieve an overall protection characteristic suitable for a particular application, including an asymmetric characteristic that includes high and/or low positive or negative blocking voltages. In one embodiment, the forward conduction trigger voltage is selected to be in the range of about 5 V to about 15 V, and the reverse conduction trigger voltage is selected to be in the range of about −5 V to about −15 V. However, persons having ordinary skill in the art will readily appreciate other voltages, such as voltages that depend on system and/or process constraints.

Although the multi-gate HEMT 9 is illustrated as including four gates, the multi-gate HEMT 9 can be modified to include additional gates. Additionally, in certain implementations, the first D-mode gate 1 and/or the second D-mode gate 2 can be omitted.

Figure 2:
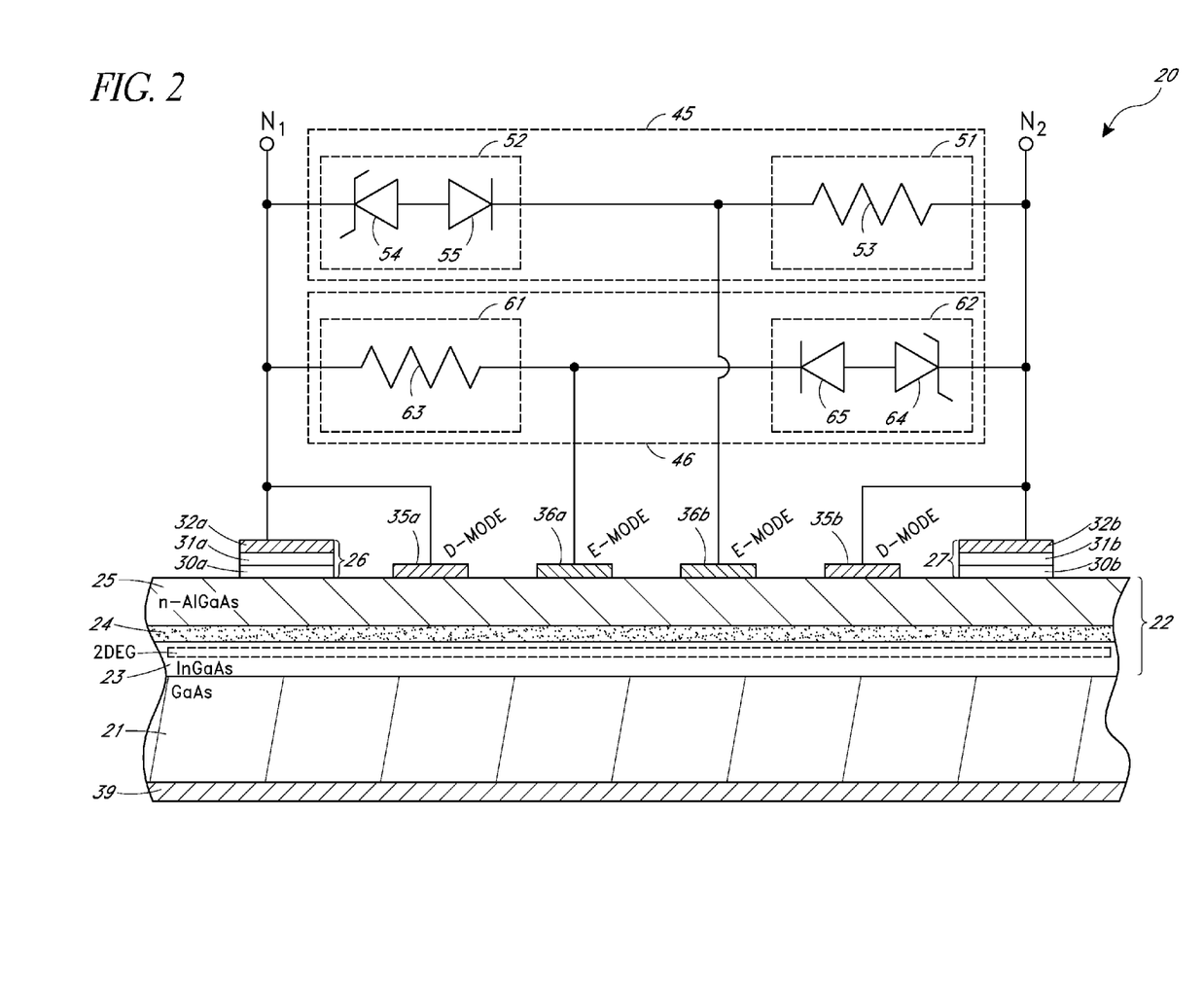
FIG. 2 is a cross-section of a compound semiconductor protection device implementing the bidirectional blocking voltage heterojunction compound semiconductor protection circuit of FIG. 1 according to one embodiment.

FIG. 2 is a cross-section of a compound semiconductor protection device 20 implementing the bidirectional blocking voltage heterojunction compound semiconductor protection circuit 10 of FIG. 1 according to one embodiment. The protection device 20 includes a gallium arsenide (GaAs) substrate 21, a heterojunction structure 22, a drain/source region 26, a source/drain region 27, a first D-mode gate region 35a, a second D-mode gate region 35b, a first E-mode gate region 36a, a second E-mode gate region 36b, a backside conductor 39, a forward conduction control block 45, a reverse conduction control block 46, a first terminal $N_1$, and a second terminal $N_2$.

The heterojunction structure 22 includes an indium gallium arsenide (InGaAs) layer 23 disposed over the GaAs substrate 21, a spacer layer 24 disposed over the InGaAs layer 23, and an n-type aluminum gallium arsenide (n-AlGaAs) layer 25 disposed over the spacer layer 24. The drain/source region 26 is disposed over the heterojunction structure 22 and includes a first n-type GaAs region 30a, a first highly doped n-type GaAs region 31a disposed over the first n-type GaAs region 30a, and a first contact region 32a disposed over the first highly doped n-type GaAs region 31a. Additionally, the source/drain region 27 is disposed over the heterojunction structure 22 adjacent the drain/source region 26, and includes a second n-type GaAs region 30b, a second highly doped n-type GaAs region 31b disposed over the second n-type GaAs region 30b, and a second contact region 32b disposed over the second highly doped n-type GaAs region 31b. In the illustrated configuration, the first and second highly doped n-type GaAs regions 31a, 31b have a higher doping concentration that the first and second doped n-type GaAs regions 30a, 30b.

The first E-mode gate region 36a is disposed over the heterojunction structure 22 between the drain/source region 26 and the source/drain region 27. Additionally, the second E-mode gate region 36b is disposed over the heterojunction structure 22 between the first E-mode gate region 36a and the source/drain region 27. Additionally, the first D-mode gate region 35a is disposed over the heterojunction structure 22 between the first E-mode gate region 36a and the drain/source region 26. Furthermore, the second D-mode gate region 35b is disposed over the heterojunction structure 22 between the second E-mode gate region 36b and the source/drain region 27. In certain implementations, the first and second D-mode gate regions 35a, 35b and the first and second E-mode gate regions 36a, 36b include metal. For example, in one embodiment the first and second D-mode gate regions 35a, 35b and the first and second E-mode gate regions 36a, 36b include at least one of nickel (Ni), gold (Au), titanium (Ti), or platinum (Pt). As skilled artisans will appreciate, a metal-semiconductor junction associated with a gate of a HEMT can operate as a metal-semiconductor or Schottky diode structure.

The GaAs substrate 21 can be an intrinsic substrate having a relatively low doping concentration. In certain implementations, the GaAs substrate 21 can have a relatively thin substrate thickness, such as a thickness in range of about 0.5 μm to about 1 μm. Configuring the GaAs substrate 21 to be relatively thin can aid in forming through-wafer vias (TWVs), which can be used to connect transistors or other circuitry fabricated on the GaAs substrate 21 to the backside conductor 39. Although particular doping concentrations and thicknesses have been described, persons of ordinary skill in the art will readily determine other suitable values.

The heterojunction structure 22, the drain/source region 26, the source/drain region 27, the first D-mode gate region 35a, the second D-mode gate region 35b, the first E-mode gate region 36a, and the second E-mode gate region 36b operate as a multi-gate HEMT. For example, as skilled artisans will appreciate, diffusion of electrons from the n-AlGaAs layer 25 into the InGaAs layer 23 can result in the formation of a two-dimensional electron gas (2DEG) region or channel within the InGaAs layer 23. The conductivity of the 2DEG region can be altered or changed by controlling the gate voltages of the first D-mode gate region 35a, the second D-mode gate region 35b, the first E-mode gate region 36a, and the second E-mode gate region 36b.

In one embodiment, the n-AlGaAs layer 25 has a thickness in the range of about 300 nm to about 500 nm, and a doping concentration in the range of about $1 \times 10^{18}$ atoms/cm$^3$ about $9 \times 10^{18}$ atoms/cm$^3$. The InGaAs layer 23 can be configured to have a relatively low doping concentration so as to enhance the mobility of electrons by avoiding collisions with doping impurities. For example, in one embodiment the InGaAs layer 23 has a thickness in the range of about 5 nm to about 15 nm, and a doping concentration of less than about $1 \times 10^{18}$ atoms/cm$^3$. The spacer layer 24 can aid in reducing interface traps or defects between the interface of the InGaAs layer 23 and n-AlGaAs layer 25 associated with different lattice constants of the layers. In one embodiment, the spacer layer 24 includes a layer of AlGaAs having a thickness in the range of about 3 nm to about 6 nm. In certain implementations, one or more layers of the heterojunction structure 22 can be formed using an epitaxial growth process. Although particular doping concentrations and thicknesses have been described, persons of ordinary skill in the art will readily determine other suitable values.

The backside conductor 39 is disposed adjacent the GaAs substrate 21 on a side of the GaAs substrate 21 opposite the heterojunction structure 22. The backside conductor 39 can be electrically biased using a power low or ground supply, and TWVs formed in the GaAs substrate 21 can be used to provide electrical connections between circuitry and the ground supply. For example, in one embodiment the second terminal $N_2$ is electrically connected to the backside conductor 39 using one or more TWVs. In certain implementations, the backside conductor 39 includes at least one of gold (Au) or copper (Cu). Although the backside conductor 39 is illustrated as a single layer, the backside conductor 39 can include multiple sublayers, including, for example, seed and/or barrier sublayers.

In the illustrated configuration, the drain/source region 26 is an explicit drain/source region and the source/drain region 27 is an explicit source/drain region. However, the illustrated multi-HEMT transistor can operate functionally similar to a series combination of a first D-mode HEMT, a first E-mode HEMT, a second E-mode HEMT, and a second D-mode HEMT. Accordingly, in certain implementations a first portion of the 2DEG region between the first D-mode gate region 35a and the first E-mode gate region 36a can operate as a first intrinsic source/drain region, a second portion of the 2DEG region between the first E-mode gate region 36a and the second E-mode gate region 36b can operate as an intrinsic drain/source region, and a third portion of the 2DEG region between the second E-mode gate region 36b and the second D-mode gate region 35b can operate as a second intrinsic source/drain region.

Although protection device 20 has been illustrated in the context of a GaAs process, the teachings herein are applicable to other compound semiconductor technologies, including, for example, gallium nitride (GaN) and indium phosphide (InP).

The drain/source region 26 and the first D-mode gate region 35a are electrically connected to the first terminal $N_1$, and the source/drain region 27 and the second D-mode gate region 35b are electrically connected to the second terminal $N_2$. Additionally, the forward conduction control block 45 includes a first input electrically connected to the first terminal $N_1$, a second input electrically connected to the second terminal $N_2$, and a control output electrically connected to the second E-mode gate region 36b. Additionally, the reverse conduction control block 46 includes a first input electrically connected to the first terminal $N_1$, a second input electrically connected to the second terminal $N_2$, and a control output electrically connected to the first E-mode gate region 36a.

The illustrated forward conduction control block 45 includes a first current limiting circuit 51 and a forward trigger control circuit 52. The first current limiting circuit 51 includes a first current limiting resistor 53 and the forward trigger control circuit 52 includes a first reverse breakdown diode 54 and a first diode 55. The first current limiting resistor 53 is electrically connected between the second E-mode gate region 36b and the second terminal $N_2$. The first reverse breakdown diode 54 includes a cathode electrically connected to the first terminal $N_1$, and the diode 55 includes a cathode electrically connected to the second E-mode gate region 36b and an anode electrically connected to an anode of the first reverse breakdown diode 54.

The illustrated reverse conduction control block 46 includes a second current limiting circuit 61 and a reverse trigger control circuit 62. The second current limiting circuit 61 includes a second current limiting resistor 63 and the reverse trigger control circuit 62 includes a second reverse breakdown diode 64 and a second diode 65. The second current limiting resistor 63 is electrically connected between the first E-mode gate region 36a and the first terminal $N_1$. The second reverse breakdown diode 64 includes a cathode electrically connected to the second terminal $N_2$, and the second diode 65 includes a cathode electrically connected to the first E-mode gate region 36a and an anode electrically connected to an anode of the second reverse breakdown diode 64.

The first and second reverse breakdown diodes 54, 64 can be used to provide a relatively large reference breakdown voltage, thereby configuring the protection device with relatively high bidirectional blocking voltages suitable for certain high voltage applications. In certain implementations, the reverse breakdown diodes 54, 64 can be Zener diodes or other diode-based structures configured to emulate or operate similar to a Zener diode. For example, in some implementations the first reverse breakdown diode 54 and/or the second reverse breakdown diode 64 can include a reverse-biased junction diode that is doped or otherwise configured to provide a desired current-handling capability and/or reverse breakdown reference voltage. However, other configurations are possible, including implementations in which the first reverse breakdown diode 54 and/or the second reverse breakdown diode 64 include a series combination of forward-biased Schottky diodes arranged to provide a desired reverse breakdown reference voltage. Using junction diodes and/or Schottky diodes can aid in providing a customizable and controllable reverse breakdown reference voltage, even when a protection device is fabricated in a relatively low-cost process in which Zener diodes are not readily available.

Accordingly, the first and second reverse breakdown diodes 54, 64 can be used to configure the protection device 20 with relatively high forward and reverse activation trigger voltages, respectively. Configuring a protection device to include one or more reverse breakdown diodes or other high breakdown voltage components can be useful in high blocking voltage applications, such as implementations in which the forward activation trigger voltage is greater than a power high supply voltage and/or the reverse activation trigger voltage is less than a power low supply voltage.

The first current limiting resistor 53 can be used to bias the voltage of the second E-mode gate region 36b to be about equal to the voltage of the second terminal $N_2$ when a voltage difference between the first and second terminals $N_1$, $N_2$ is less than a forward conduction trigger voltage of the forward trigger control circuit 52. Similarly, the second current limiting resistor 63 can be used to bias the voltage of the first E-mode gate region 36a to be about equal to the voltage of the first terminal $N_1$ when a voltage difference between the first and second terminals $N_1$, $N_2$ is greater than a reverse conduction trigger voltage of the reverse trigger control circuit 62. In one embodiment, the first and second current limiting resistors 53, 63 each have a resistance selected to be in the range of about 5 kΩ to about 50 kΩ. However, persons having ordinary skill in the art will readily determine other suitable resistance values.

The protection device 20 can be used to provide protection from overvoltage and/or undervoltage events received between the first and second terminals $N_1$, $N_2$.

For example, in response to an overvoltage condition, the forward trigger control circuit 52 can conduct a forward trigger current when a voltage of the first terminal $N_1$ exceeds a voltage of the second terminal $N_2$ by the forward conduction trigger voltage of the forward conduction control block 45. The forward trigger current can increase a voltage difference between the second E-mode gate region 36b and the source/drain region 27 and activate the 2DEG region beneath the second E-mode gate region 36b. Additionally, a portion of the forward trigger current can flow through the first current limiting circuit 51, which can further aid in increasing the voltage difference between the second E-mode gate region 36b and the source/drain region 27. Accordingly, a low impedance forward conduction path can be provided between the first and second terminals $N_1$, $N_2$ in response to an overvoltage condition. The forward conduction path includes a first current path from the first terminal $N_1$ to the second terminal $N_2$ through the drain/source region 26 and the 2DEG region of the InGaAs layer 23. Additionally, at a sufficiently high gate voltage, a metal-semiconductor or Schottky diode structure between the first D-mode gate region 35a and the n-AlGaAs layer 25 can become forward-biased and provide a second current path between the first and second terminals $N_1$, $N_2$ through the n-AlGaAs layer 25.

Additionally, in response to an undervoltage condition, the reverse trigger control circuit 62 can conduct a reverse trigger current when a voltage of the first terminal $N_1$ is less than a voltage of the second terminal $N_2$ by the reverse conduction trigger voltage. The reverse trigger current can increase a voltage difference between the first E-mode gate region 36a and the drain/source region 26. Additionally, a portion of the reverse trigger current can flow through the second current limiting circuit 61, which can further increase the voltage difference between the first E-mode gate region 36a and the drain/source region 26. Accordingly, a low impedance reverse conduction path can be provided between the first and second terminals $N_1$, $N_2$ in response to an undervoltage event. The low impedance reverse conduction path can include a first current path through the 2DEG region vias the source/drain region 27 and a second current path through the n-AlGaAs layer 25 via the Schottky diode associated with the second D-mode gate region 35b.

Although one implementation of the first and second current limiting circuits 51, 61 have been illustrated in FIG. 2, other configurations are possible, including, for example, configurations in which current limiting resistors are implemented using active devices and/or configurations in which current limiting resistors are omitted or used in combination with other current limiting elements. Additionally, although one suitable implementation of the forward and reverse trigger control circuits 52, 62 has been illustrated, other implementations are possible. For example, one or more diodes and/or other structures can be connected in series or otherwise configured to achieve forward and reverse conduction trigger voltages of a desired value.

Figure 3:
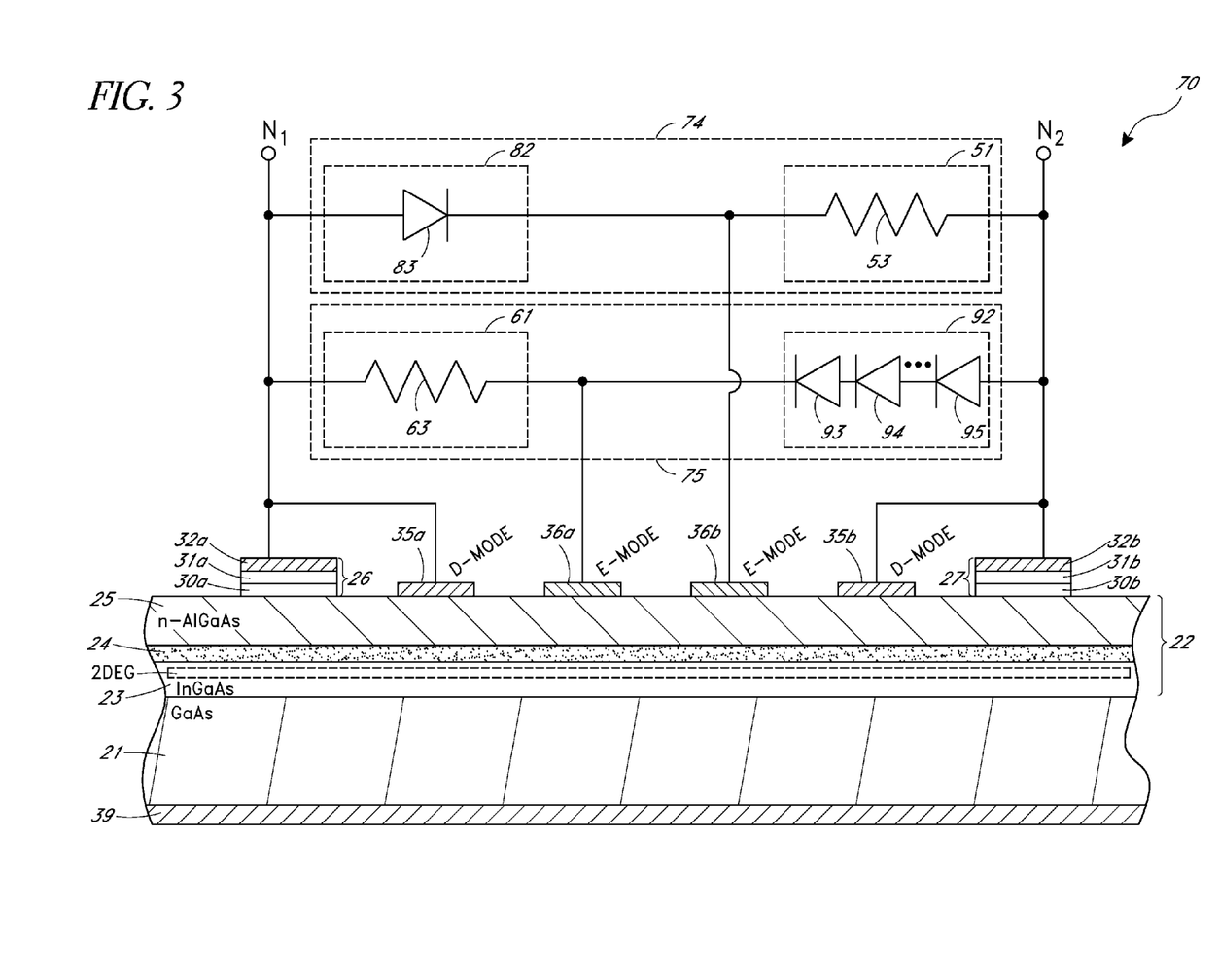
FIG. 3 is a cross-section of a compound semiconductor protection device implementing the bidirectional blocking voltage heterojunction compound semiconductor protection circuit of FIG. 1 according to another embodiment.

FIG. 3 is a cross-section of a compound semiconductor protection device 70 implementing the bidirectional blocking voltage heterojunction compound semiconductor protection circuit 10 of FIG. 1 according to another embodiment.

The protection device 70 of FIG. 3 is similar to the protection device 20 of FIG. 2, except that the protection device 70 includes a different implementation of forward and reverse trigger control circuits. For example, the forward conduction control block 74 of FIG. 3 includes a forward trigger control circuit 82 including a diode 83 having an anode electrically connected to the first terminal $N_1$ and a cathode electrically connected to the second E-mode gate region 36b. Additionally, the reverse conduction control block 75 of FIG. 3 includes a reverse trigger control circuit 92 including first to third diodes 93-95 electrically connected in series between the first E-mode gate region 36a and the second terminal $N_2$. The first diode 93 includes a cathode electrically connected to the first E-mode gate region 36a and an anode electrically connected to a cathode of the second diode 94, and the third diode 95 includes an anode electrically connected to the second terminal $N_2$ and a cathode electrically connected to an anode of the second diode 94.

In contrast to the protection device 20 of FIG. 2, the protection device 70 of FIG. 3 does not include the first and second reverse breakdown diodes 54, 64. Omitting the first and second reverse breakdown diodes 54, 64 can aid in providing the protection device 20 with relatively low forward and reverse activation trigger voltages, respectively. For example, the illustrated forward trigger control circuit 82 includes a single diode 83, and thus the forward trigger activation trigger voltage can be about a diode forward voltage drop. By selecting the number of diodes in the forward trigger control circuit 82 and the reverse trigger control circuit 92, a desired forward activation trigger voltage and reverse activation trigger voltage can be achieved.

Although one configuration of the forward and reverse trigger control circuits has been illustrated, other implementations of the forward and reverse trigger control circuits can be used. For example, the forward trigger control circuit 82 can include additional diodes or other elements configured to achieve a desired forward activation trigger voltage. Likewise, the reverse trigger control circuit 92 can include more or fewer diodes or other elements configured to achieve a desired reverse activation trigger voltage.

Figure 4A:
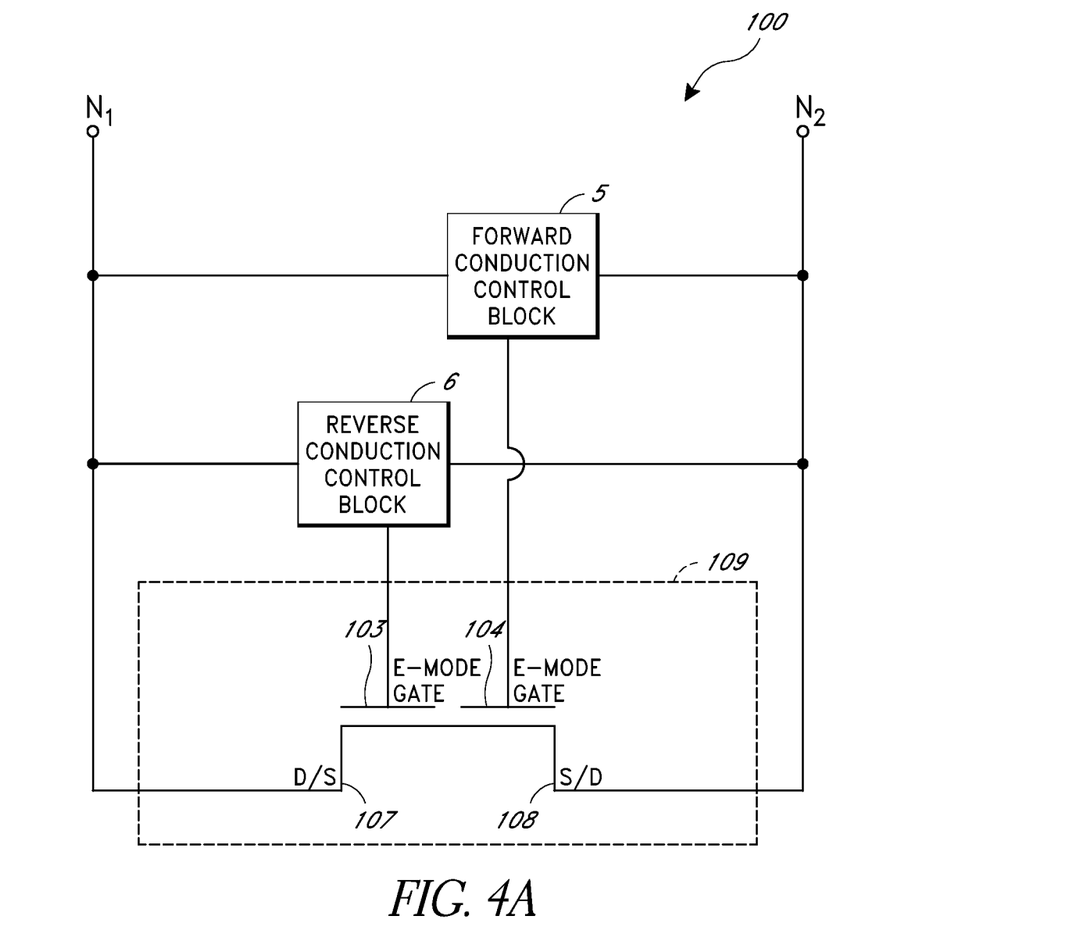
FIG. 4A is a circuit diagram of another embodiment of a bidirectional blocking voltage heterojunction compound semiconductor protection circuit.

FIG. 4A is a circuit diagram of another embodiment of a bidirectional blocking voltage heterojunction compound semiconductor protection circuit 100. The protection circuit 100 includes forward and reverse conduction control blocks 5, 6 and a multi-gate HEMT 109. The multi-gate HEMT 109 includes a drain/source region 107, a source/drain region 108, a first E-mode gate 103 and a second E-mode gate 104. The first E-mode gate 103 is between the drain/source region 107 and the second E-mode gate 104, and the second E-mode gate 104 is between the first E-mode gate 103 and the source/drain region 108. As shown in FIG. 4A, the drain/source region 107 is electrically connected to the first terminal $N_1$ and the source/drain region 108 is electrically connected to the second terminal $N_2$. Additionally, the forward conduction control block 5 is electrically connected between the first and second terminals $N_1$, $N_2$ and is configured to control the voltage of the second E-mode gate 104. Furthermore, the reverse conduction control block 6 is electrically connected between the first and second terminals $N_1$, $N_2$ and is configured to control the voltage of the first E-mode gate 103.

In a manner similar to that described earlier with respect to FIG. 1, the protection circuit 100 of FIG. 4A can have forward and reverse activation trigger voltages controlled by the forward and reverse conduction control blocks 5, 6, respectively. However, in contrast to the protection circuit 10 of FIG. 1, the protection circuit 100 of FIG. 4A omits the first and second D-mode gate regions 1, 2. Since the first and second D-mode gate regions 1, 2 can have associated metal-semiconductor or Schottky diode structures that operate as current paths at high voltages, omitting the first and second D-mode gate regions 1, 2 can reduce the current handling capability of the protection circuit 100 of FIG. 4A relative to the protection circuit 10 of FIG. 1. However, the protection circuit 100 of FIG. 4 can be manufactured using a simpler fabrication process relative to the protection circuit 100 of FIG. 1, and thus the protection circuit 100 can have reduced cost and/or improved yield.

Figure 4B:
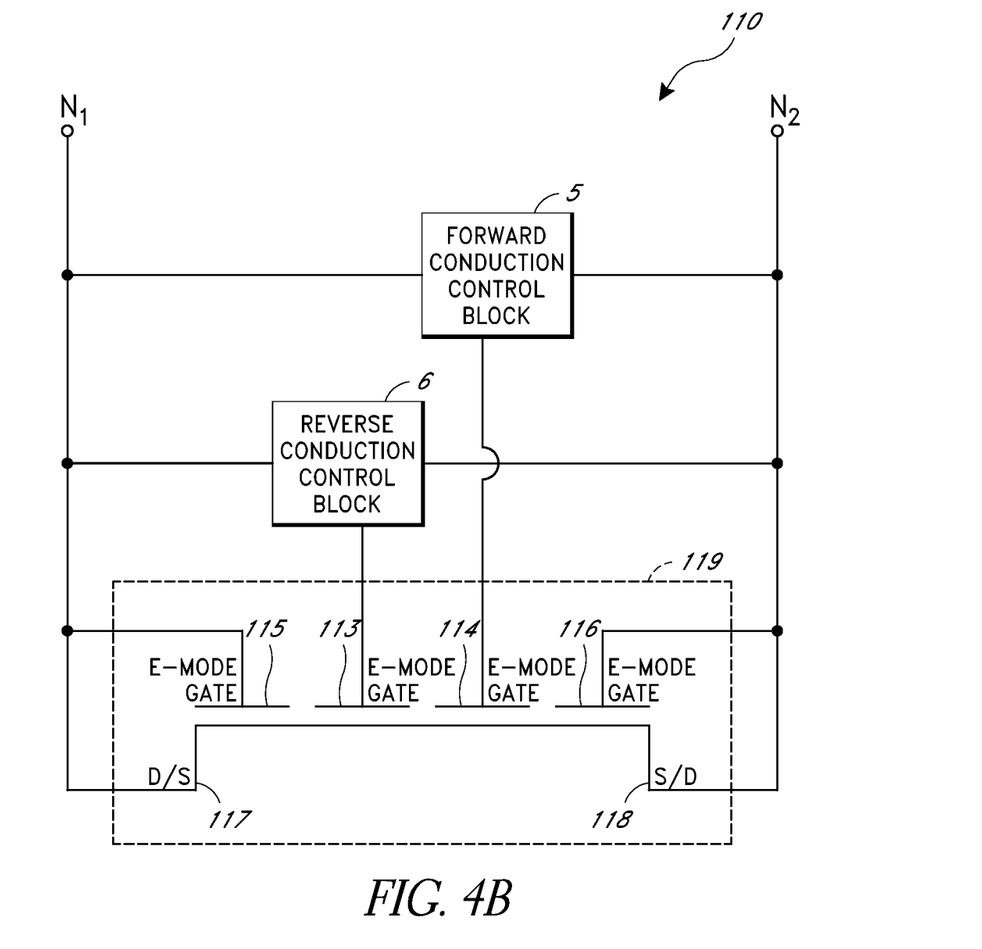
FIG. 4B is a circuit diagram of yet another embodiment of a bidirectional blocking voltage heterojunction compound semiconductor protection circuit.

FIG. 4B is a circuit diagram of another embodiment of a bidirectional blocking voltage heterojunction compound semiconductor protection circuit 110. The protection circuit 110 includes forward and reverse conduction control blocks 5, 6 and a multi-gate HEMT 119. The multi-gate HEMT 119 includes a drain/source region 117, a source/drain region 118, a first E-mode gate 113, a second E-mode gate 114, a third E-mode gate 115, and a fourth E-mode gate 116. The protection circuit 110 of FIG. 4B is similar to the protection circuit 10 of FIG. 1, except the protection circuit 110 of FIG. 4B illustrates a configuration in which the first and second D-mode gates 1, 2 of FIG. 1 have been replaced with the third and fourth E-mode gates 115, 116, respectively. Configuring the protection circuit 110 in this manner can reduce the protection device's current handling capability. For example, during an overvoltage or undervoltage condition, the conductivity of the channel or 2DEG region of the multi-gate HEMT 9 of FIG. 1 can be greater than the conductivity of the channel of the multi-gate HEMT 119 of FIG. 4B. However, the multi-gate HEMT 119 of FIG. 4B can be fabricated without needing to form depletion-mode gates, and thus can be manufactured with lower cost and/or higher yield relative to the multi-gate HEMT 9 of FIG. 1.

Figure 5:
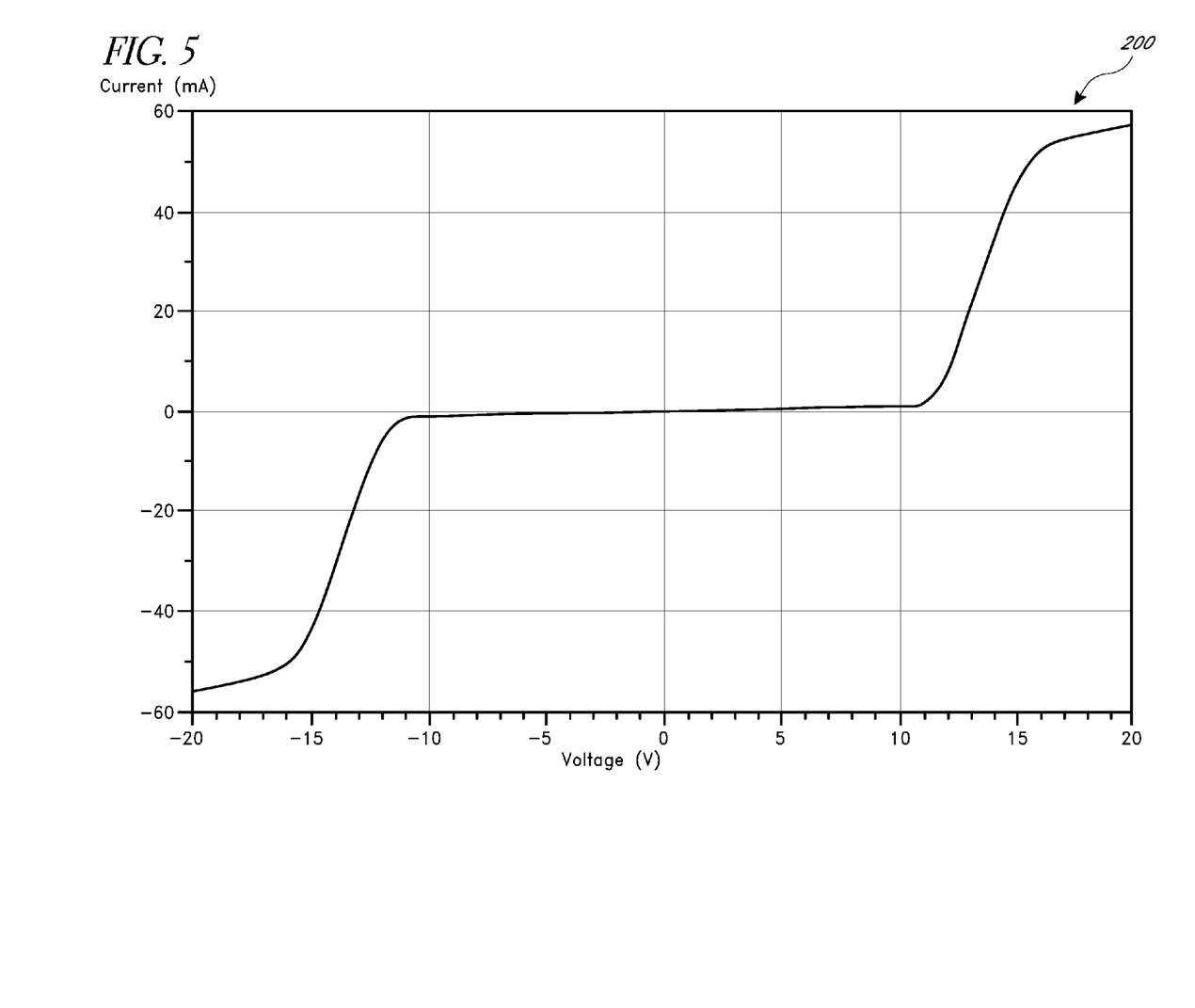
FIG. 5 is a graph of voltage versus current for one example of the bidirectional blocking voltage heterojunction compound semiconductor protection circuit of FIG. 1.

FIG. 5 is a graph 200 of voltage versus current for one example of the bidirectional blocking voltage heterojunction compound semiconductor protection circuit 10 of FIG. 1. Voltage is expressed along a horizontal axis, and current is expressed along a vertical axis. The graph 200 illustrates a current versus voltage response for a configuration of protection circuit 10 of FIG. 1 in which the forward conduction trigger voltage has been configured to be about +12 V and in which the reverse conduction trigger voltage has been configured to be about −12 V. However, the forward and reverse conduction trigger voltages can be configured to be other voltage values, including trigger voltages that have asymmetric voltage magnitudes, to achieve a desired protection characteristic suitable for a particular application.

Figure 6:
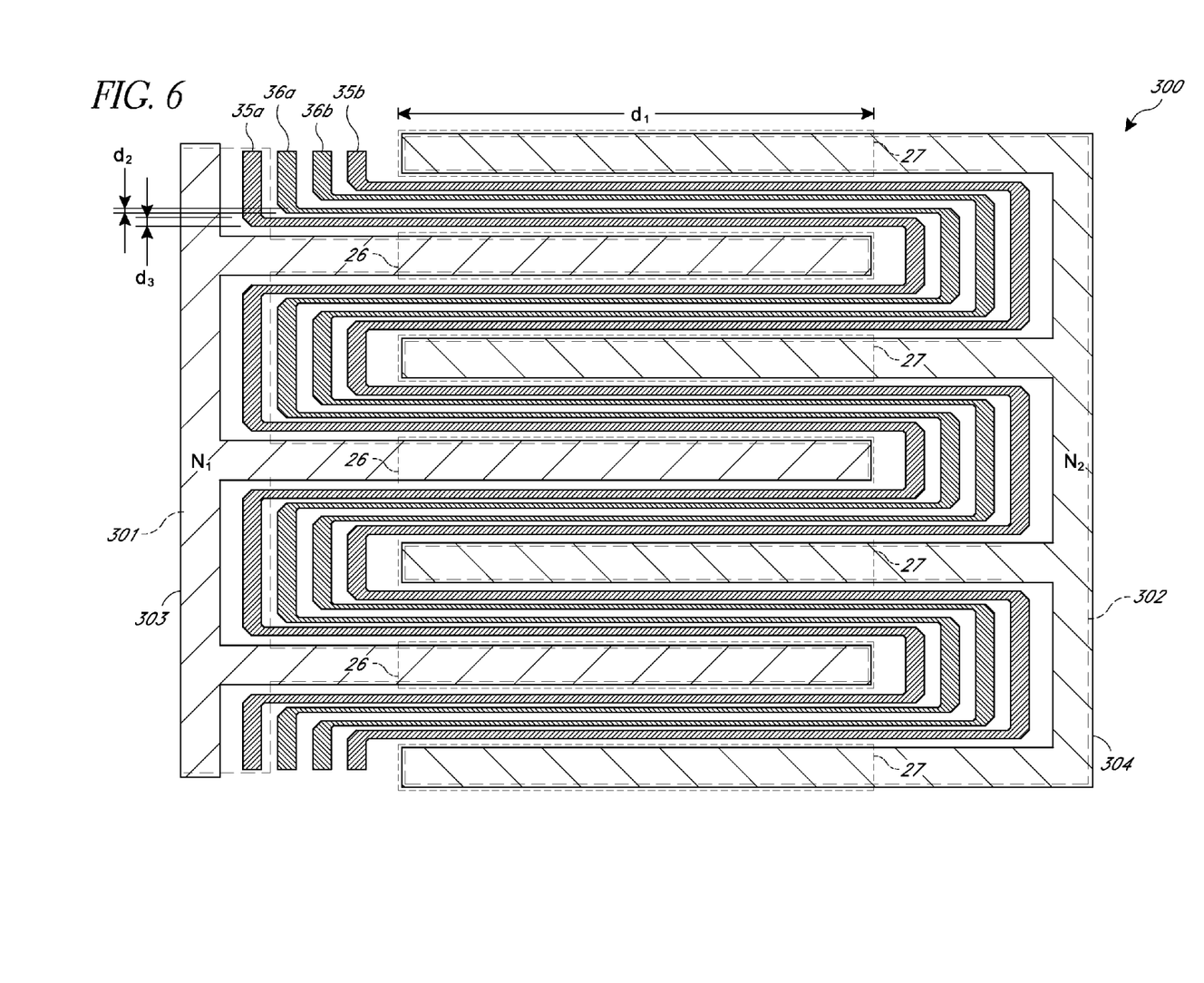
FIG. 6 is a plan view of a compound semiconductor protection device implementing the multi-gate high electron mobility transistor (HEMT) of FIG. 1 according to one embodiment.

FIG. 6 is a plan view of a compound semiconductor protection device 300 implementing the multi-gate HEMT 9 of FIG. 1 according to one embodiment. The protection device 300 includes drain/source regions 26, source/drain regions 27, first and second D-mode gate regions 35a, 35b, first and second E-mode gate regions 36a, 36b, a first lower metal or METAL1 region 301, a second METAL1 region 302, a first upper metal or METAL2 region 303, and a second METAL2 region 304. The compound semiconductor protection device 300 is fabricated on a substrate, such as a GaAs substrate, and can include other structures or features including, for example, a heterojunction structure, contact regions, vias, and/or additional metal regions. Skilled artisans will appreciate that these details have been omitted from this figure for clarity.

The drain/source regions 26 and the source/drain regions 27 have been arranged adjacent one another in a column with each drain/source region 26 positioned between two adjacent source/drain regions 27. In the illustrated configuration, each of the drain/source regions 26 and the source/drain regions 27 have a width $d_1$, which in certain implementations can be, for example, in the range of about 50 µm to about 1000 µm. However, persons having ordinary skill in the art will readily appreciate other suitable region widths. Although FIG. 6 illustrates a configuration using three drain/source regions 26 and four source/drain regions 27, the protection device 300 can include more or fewer drain/source regions 26 and/or source/drain regions 27. For example, in one embodiment the total number of drain/source regions 26 and source/drain regions 27 is selected to be in the range of about 2 to about 24.

The first and second D-mode gate regions 35a, 35b and the first and second E-mode gate regions 36a, 36b have been implemented as serpentine-shaped structures that wind or turn between the drain/source regions 26 and the source/drain regions 27. As illustrated in FIG. 6, the first and second E-mode gate regions 36a, 36b have a width $d_2$ and the first and second D-mode gate regions 35a, 35b have a width $d_3$. In one embodiment, the width $d_3$ of the first and second D-mode gate regions 35a, 35b is selected to be between about 2 times to about 5 times greater than the width $d_2$ of the first and second E-mode gate regions 36a, 36b. However, other configurations are possible. Additionally, although FIG. 6 illustrates a configuration in which the D-mode gate regions have matching widths and in which the E-mode gate regions have matching widths, in other implementations the D-mode and E-mode gate widths can be asymmetric.

The first METAL1 region 301 has been configured to provide electrical connections between different portions of the first D-mode gate region 35a. For example, the illustrated first D-mode gate region 35a is serpentine-shaped and includes turns having edge portions, and the first METAL1 region 301 has been used to electrically connect edge portions associated with a first or left side of the device. Connecting the first METAL1 region 301 in this manner can reduce the resistance of first D-mode gate region 35a, thereby helping the device to conduct current uniformly. In certain implementations, the first METAL2 region 303 is disposed over and electrically connected to at least a portion of the first METAL1 region 301 so as to further reduce gate resistance and promote uniform current conduction. As shown in FIG. 6, portions of the first METAL1 region 301 have been configured to extend between turns of the first D-mode gate region 35a and electrically contact the drain/source regions 26. The first METAL1 region 301 and/or the first METAL2 region 303 can operate as the first terminal $N_1$ of the protection device 300.

The second METAL1 region 302 has been configured to provide electrical connections between edge portions of the second D-mode gate region 35b associated with a second or right side of the device. Additionally, portions of the second METAL1 region 302 have been configured to extend between turns of the second D-mode gate region 35b and electrically contact the source/drain regions 27. In certain implementations, the second METAL2 region 304 is disposed over and electrically connected to at least a portion of the second METAL1 region 302. The second METAL1 region 302 and/or the second METAL2 region 304 can operate as the second terminal $N_2$ of the protection device 300.

Additional details of the protection device 300 can be similar to those described earlier with reference to FIGS. 1-3. Although the protection device 300 illustrates one implementation of a suitable layout for a compound semiconductor protection device, other implementations can be used.

Terms such as above, below, over and so on as used herein refer to a device orientated as shown in the figures and should be construed accordingly. It should also be appreciated that because regions within a semiconductor device (such as a transistor) are defined by doping different parts of a semiconductor material with differing impurities or differing concentrations of impurities, discrete physical boundaries between different regions may not actually exist in the completed device but instead regions may transition from one to another. Some boundaries as shown in the accompanying figures are of this type and are illustrated as abrupt structures merely for the assistance of the reader. In the embodiments described above, p-type regions can include a p-type semiconductor material, such as boron, as a dopant. Further, n-type regions can include an n-type semiconductor material, such as phosphorous, as a dopant. A skilled artisan will appreciate various concentrations of dopants in regions described above.

Applications

Devices employing the above described protection schemes can be implemented into various electronic devices and interface applications. Examples of the electronic devices can include, but are not limited to, consumer electronic products, parts of the consumer electronic products, electronic test equipment, high robustness industrial and automotive applications, etc. Examples of the electronic devices can also include circuits of optical networks or other communication networks. The consumer electronic products can include, but are not limited to, a mobile phone, a telephone, a television, a computer monitor, a computer, a hand-held computer, a personal digital assistant (PDA), an automobile, a vehicle engine management controller, a transmission controller, a seatbelt controller, an anti-lock brake system controller, a camcorder, a camera, a digital camera, a portable memory chip, a washer, a dryer, a washer/dryer, a copier, a facsimile machine, a scanner, a multi functional peripheral device, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus comprising:
 a multi-gate high electron mobility transistor (HEMT) comprising a drain/source, a source/drain, a first enhancement-mode (E-mode) gate, and a second E-mode gate, wherein the first E-mode gate is disposed between the drain/source and the second E-mode gate, wherein the second E-mode gate is disposed between the first E-mode gate and the source/drain, and wherein the drain/source is electrically connected to a first terminal, and wherein the source/drain is electrically connected to a second terminal;
 a forward conduction control block electrically connected between the first terminal and the second terminal and configured to control a voltage of the gate of the second E-mode gate, wherein the forward conduction control block is configured to turn on the second E-mode gate when a voltage difference between the first and second terminals is greater than a forward conduction trigger voltage and to otherwise bias the second E-mode gate based on a voltage of the second terminal; and
 a reverse conduction control block electrically connected between the first terminal and the second terminal and configured to control a voltage of the gate of the first E-mode gate, wherein the reverse conduction control block is configured to turn on the first E-mode gate when the voltage difference is less than a reverse conduction trigger voltage and to otherwise bias the first E-mode gate based on a voltage of the first terminal.

2. The apparatus of claim 1, wherein the forward conduction control block is configured to turn-off the second E-mode gate when the voltage difference is positive but less than the forward conduction trigger voltage, and wherein the reverse conduction control block is configured to turn-off the first E-mode gate when the voltage difference is negative but greater than the reverse conduction trigger voltage.

3. The apparatus of claim 1, wherein the forward conduction control block is configured to control the voltage of the second E-mode gate to be about equal to the voltage of the second terminal when the voltage difference is less than the forward conduction trigger voltage, and wherein the reverse conduction control block is configured to control the voltage of the first E-mode gate to be about equal to the voltage of the first terminal when the voltage difference is greater than the reverse conduction trigger voltage.

4. The apparatus of claim 1, wherein the forward conduction control block comprises a first current limiting circuit connected between the second E-mode gate and the second terminal and a forward trigger control circuit connected between the first terminal and the second E-mode gate, wherein the forward trigger control circuit is configured to conduct a forward trigger current when the voltage difference is greater than the forward conduction trigger voltage so as to provide a first activation voltage to the second E-mode gate.

5. The apparatus of claim 4, wherein the reverse conduction control block comprises a second current limiting circuit connected between the first E-mode gate and the first terminal and a reverse trigger control circuit connected between the second terminal and the first E-mode gate, wherein the reverse trigger control circuit is configured to conduct a reverse trigger current when the voltage difference is less than the reverse conduction trigger voltage so as to provide a second activation voltage to the first E-mode gate.

6. The apparatus of claim 5, wherein at least a portion of the forward trigger current is configured to flow through the first current limiting circuit when the voltage of the first terminal exceeds the voltage of the second terminal by the forward conduction trigger voltage, and wherein at least a portion of the reverse trigger current is configured to flow through the second current limiting circuit when the voltage of the second terminal exceeds the voltage of the first terminal by the reverse conduction trigger voltage.

7. The apparatus of claim 5, wherein the first current limiting circuit comprises a first resistor, and wherein the second current limiting circuit comprises a second resistor.

8. The apparatus of claim 5, wherein the forward trigger control circuit comprises one or more diodes electrically connected in series between the first terminal and the second E-mode gate, wherein the one or more diodes of the forward conduction control block are reverse-biased when the voltage of the second terminal exceeds the voltage of the first terminal, and wherein the reverse trigger control circuit comprises one or more diodes electrically connected in series between the second terminal and the first E-mode gate, wherein the one or more diodes of the reverse conduction control block are reverse-biased when the voltage of the first terminal exceeds the voltage of the second terminal.

9. The apparatus of claim 5, wherein the forward trigger control circuit comprises a first reverse breakdown diode and a first diode, wherein the first reverse breakdown diode comprises a cathode electrically connected to the first terminal, and wherein the first diode comprises a cathode electrically connected to the second E-mode gate and an anode electrically connected to an anode of the first reverse breakdown diode, and wherein the reverse trigger control circuit comprises a second reverse breakdown diode and a second diode, and wherein the second reverse breakdown diode comprises a cathode electrically connected to the second terminal, and wherein the second diode comprises a cathode electrically connected to the first E-mode gate and an anode electrically connected to an anode of the second reverse breakdown diode.

10. The apparatus of claim 9, wherein the first and second reverse breakdown diodes comprise at least one of a Zener diode, a reverse-biased junction diode, or a plurality of forward-biased Schottky diodes arranged in series.

11. The apparatus of claim 1, wherein the forward conduction trigger voltage and the reverse conduction trigger voltage have different voltage magnitudes.

12. The apparatus of claim 1, wherein the multi-gate HEMT is a pseudomorphic high electron mobility transistor (pHEMT).

13. The apparatus of claim 1, further comprising a first depletion-mode (D-mode) gate and a second D-mode gate, wherein the first D-mode gate is disposed between the drain/source and the first E-mode gate, wherein the second D-mode gate is disposed between the second E-mode gate and the source/drain, and wherein the first D-mode gate is electrically connected to the first terminal and the second D-mode gate is electrically connected to the second terminal.

14. The apparatus of claim 1, further comprising a third E-mode gate and a fourth E-mode gate, wherein the third E-mode gate is disposed between the drain/source and the first E-mode gate and electrically connected to the first terminal, and wherein the fourth E-mode gate is disposed between the second E-mode gate and the source/drain and electrically connected to the second terminal.

15. An apparatus comprising:
a substrate;
a heterojunction structure disposed over the substrate;
a drain/source region disposed over the heterojunction structure and electrically connected to a first terminal;
a source/drain region disposed over the heterojunction structure and electrically connected to a second terminal;
a first enhancement-mode (E-mode) gate region disposed over the heterojunction structure between the drain/source region and the source/drain region;
a second enhancement-mode (E-mode) gate region disposed over the heterojunction structure between the source/drain region and the first E-mode gate region;
a forward conduction control block electrically connected between the first terminal and the second terminal and configured to control a voltage of the second E-mode gate region; and
a reverse conduction control block electrically connected between the first terminal and the second terminal and configured to control a voltage of the first E-mode gate region.

16. The apparatus of claim 13, wherein the heterojunction structure comprises an indium gallium arsenide region and an n-type aluminum gallium arsenide region.

17. The apparatus of claim 15, wherein the heterojunction structure comprises a two-dimensional electron gas (2DEG) region disposed beneath the first E-mode gate region and the second E-mode gate region.

18. The apparatus of claim 15, wherein the forward conduction control block comprises a first current limiting circuit electrically connected between the second E-mode gate region and the second terminal and a forward trigger control circuit electrically connected between the first terminal and the second E-mode gate region, and wherein the reverse conduction control block comprises a second current limiting circuit electrically connected between the first E-mode gate region and the first terminal and a reverse trigger control circuit electrically connected between the second terminal and the first E-mode gate region.

19. The apparatus of claim 15, further comprising a first signal pad and a backside conductor, wherein the first terminal is electrically connected to the first signal pad, and wherein the second terminal is electrically connected to the backside conductor.

20. The apparatus of claim 15, wherein the substrate comprises gallium arsenide.

21. The apparatus of claim 15, further comprising:
a first depletion-mode (D-mode) gate region disposed over the heterojunction structure between the drain/source region and the first E-mode gate region, wherein the first D-mode gate region is electrically connected to the first terminal; and
a second D-mode gate region disposed over the heterojunction structure between the source/drain region and the second E-mode gate region, wherein the second D-mode gate region is electrically connected to the second terminal.

22. The apparatus of claim 21, wherein a width of the first and second D-mode gate regions is between about 2 times to about 5 times greater than a width of the first and second E-mode gate regions.

23. The apparatus of claim 15, further comprising a third E-mode gate disposed over the heterojunction structure and a fourth E-mode gate disposed over the heterojunction structure, wherein the third E-mode gate is disposed between the drain/source and the first E-mode gate and electrically connected to the first terminal, and wherein the fourth E-mode gate is disposed between the second E-mode gate and the source/drain and electrically connected to the second terminal.

24. A method of making a compound semiconductor bidirectional protection circuit, the method comprising:
forming a heterojunction structure over a substrate;
forming a drain/source region over the heterojunction structure;
forming a source/drain region over the heterojunction structure;
forming a first enhancement-mode (E-mode) gate region over the heterojunction structure, wherein the first E-mode gate region is disposed between the drain/source region and the source/drain region;
forming a second E-mode gate region over the heterojunction structure, wherein the second E-mode gate region is disposed between the source/drain region and the first E-mode gate region;
forming a forward conduction control block, wherein the forward conduction control block includes a first terminal electrically connected to the drain/source region, a second terminal electrically connected to the source/drain region, and a control terminal electrically connected to the second E-mode gate region; and
forming a reverse conduction control block, wherein the reverse conduction control block includes a first terminal electrically connected to the drain/source region, a second terminal electrically connected to the source/drain region, and a control terminal electrically connected to the first E-mode gate region.

25. The method of claim 24, further comprising:
forming a first depletion-mode (D-mode) gate region over the heterojunction structure, wherein the first D-mode gate region is disposed between the drain/source region and the first E-mode gate region; and
forming a second D-mode gate region over the heterojunction structure, wherein the second D-mode gate region is disposed between the source/drain region and the second E-mode gate region.

26. The method of claim 24, further comprising:
forming a third E-mode gate disposed over the heterojunction structure, wherein the third E-mode gate is disposed between the drain/source and the first E-mode gate, and forming a fourth E-mode gate disposed over the heterojunction structure, wherein the fourth E-mode gate is disposed between the second E-mode gate and the source/drain region.

* * * * *

UNITED STATES PATENT AND TRADEMARK OFFICE
CERTIFICATE OF CORRECTION

PATENT NO.       : 9,184,098 B2
APPLICATION NO.  : 13/625577
DATED            : November 10, 2015
INVENTOR(S)      : Javier A. Salcedo Page 1 of 1

It is certified that error appears in the above-identified patent and that said Letters Patent is hereby corrected as shown below:

Claims
In column 17 at line 45, in claim 16, change "claim 13," to --claim 15,--.

Signed and Sealed this
Fourteenth Day of June, 2016

Michelle K. Lee
*Director of the United States Patent and Trademark Office*